(12) United States Patent
Finn (10) Patent No.: US 10,505,542 B2
(45) Date of Patent: Dec. 10, 2019

(54) INTEGRATED CIRCUIT WITH LEVEL SHIFTER

(71) Applicant: TEXAS INSTRUMENTS INCORPORATED, Dallas, TX (US)

(72) Inventor: Steven Ernest Finn, Atlanta, GA (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/927,076

(22) Filed: Mar. 20, 2018

(65) Prior Publication Data

US 2019/0296741 A1 Sep. 26, 2019

(51) Int. Cl.
*H04L 25/00* (2006.01)
*H03K 19/0185* (2006.01)
*H03K 19/0175* (2006.01)

(52) U.S. Cl.
CPC ........... *H03K 19/018514* (2013.01); *H03K 19/017545* (2013.01)

(58) Field of Classification Search
CPC ........... H03K 19/017545; H03K 19/018514
See application file for complete search history.

(56) References Cited

U.S. PATENT DOCUMENTS

| 2008/0063091 A1* | 3/2008 | Dong ................. H04L 25/0276 375/257 |
| 2010/0225395 A1* | 9/2010 | Patterson ............ H03F 3/4508 330/253 |
| 2010/0237509 A1* | 9/2010 | Wu ........................ H01L 24/05 257/782 |
| 2012/0133414 A1* | 5/2012 | Zhuang ............ H03K 3/356113 327/333 |
| 2013/0271221 A1 | 10/2013 | Levesque et al. |

(Continued)

FOREIGN PATENT DOCUMENTS

| WO | 2011011639 | 1/2011 |
| WO | 2016044481 | 3/2016 |

OTHER PUBLICATIONS

International Search Report in corresponding PCT Application No. PCT/US2019/023200, dated Jun. 20, 2019 (2 pages).

*Primary Examiner* — Alexander H Taningco
*Assistant Examiner* — Kurtis R Bahr
(74) *Attorney, Agent, or Firm* — John R. Pessetto; Charles A. Brill; Frank D. Cimino (57) ABSTRACT

A semiconductor die. The die comprises a level shifter coupled to a positive differential input and to a negative differential input comprising a first operational amplifier, wherein the first operational amplifier is configured to generate an internal common mode voltage coupled to a positive differential output and to a negative differential output, a positive alternating current (AC) coupled feed-forward path comprising a first capacitor coupled to the positive differential input and to the positive differential output, a negative AC coupled feed-forward path comprising a second capacitor coupled to the negative differential input and to the negative differential output, a positive direct current (DC) feed-forward path coupled to the differential input, to the internal common mode voltage sense node, and to the positive differential output, and a negative DC feed-forward path coupled to the differential input, to the internal common mode voltage sense node, and to the negative differential output.

12 Claims, 5 Drawing Sheets

(56) References Cited

U.S. PATENT DOCUMENTS

| | | | |
|---|---|---|---|
| 2016/0149656 A1* | 5/2016 | Levin | H04L 25/03057 375/224 |
| 2016/0173299 A1* | 6/2016 | Islam | H04L 25/03057 375/233 |
| 2016/0218854 A1* | 7/2016 | Chong | H04L 7/0012 |
| 2017/0025816 A1* | 1/2017 | Tanaka | H04B 10/504 |
| 2017/0093525 A1* | 3/2017 | Navid | H04L 25/0272 |

* cited by examiner

INTEGRATED CIRCUIT WITH LEVEL SHIFTER

BACKGROUND

The present subject matter relates generally to broadband data transmission over wires. When a broadband transmitter is separated from a broadband receiver, the receiver desirably conditions the input signal received from the transmitter. Additionally, the receiver desirably presents an interface to the transmitter that conforms to expectations of the transmitter or is adaptable to a range of expectations of the transmitter.

SUMMARY

In accordance with at least one example, a semiconductor die, comprises a level shifter coupled to a positive differential input and coupled to a negative differential input, comprising a first operational amplifier, wherein the first operational amplifier is configured to generate an internal common mode voltage at an internal common mode voltage sense node independent of an input common mode voltage of the positive differential input and the negative differential input and where the internal common mode voltage sense node is coupled to a positive differential output and is coupled to a negative differential output. The semiconductor die comprises a positive alternating current (AC) coupled feed-forward path comprising a first capacitor coupled to the positive differential input and coupled to the positive differential output, a negative AC coupled feed-forward path comprising a second capacitor coupled to the negative differential input and coupled to the negative differential output, a positive direct current (DC) feed-forward path coupled to the differential input, coupled to the internal common mode voltage sense node, and coupled to the positive differential output, and a negative DC feed-forward path coupled to the differential input, coupled to the internal common mode voltage sense node, and coupled to the negative differential output.

In accordance with at least one example, a semiconductor die comprises a differential input conditioning stage and a data communication processing circuit. The differential input conditioning stage comprises a differential input configured to provide a predefined input impedance and to provide a predefined input common mode voltage, a level shifter coupled to the differential input and configured to generate an internal common mode voltage at an internal common voltage sense node independent of the predefined input common mode voltage, a positive alternating current (AC) coupled feed-forward path having a first capacitor coupled to the differential input and coupled to a positive differential output of the differential input conditioning stage, a negative AC coupled feed-forward path having a second capacitor coupled to the differential input and coupled to a negative differential output of the differential input conditioning stage, a positive direct current (DC) feed-forward path coupled to the differential input, coupled to the internal common mode voltage sense node, and coupled to the positive differential output of the differential input conditioning stage, and a negative DC feed-forward path coupled to the differential input, coupled to the internal common mode voltage sense node, and coupled to the negative differential output of the differential input conditioning stage. The data communication processing circuit is coupled to the positive differential output, coupled to the negative differential output of the differential input conditioning stage, is configured to output a data communication signal.

In accordance with at least one example, a communication interface integrated circuit comprises a plurality of input pins, a plurality of output pins, and a semiconductor die connected to the input pins and the output pins. The semiconductor die comprises an input conditioning circuit comprising a differential input coupled to a plurality of the input pins and configured to provide a predefined input impedance and to provide a predefined input common mode voltage, a level shifter coupled to the differential input and configured to generate an internal common mode voltage at an internal common mode voltage sense node independent of the predefined input common mode voltage, a positive alternating current (AC) coupled feed-forward path having a first capacitor coupled to a positive differential input of the differential input and coupled to a positive differential output of the input conditioning circuit, a negative AC coupled feed-forward path having a second capacitor coupled to a negative differential input of the differential input and coupled to a negative differential output of the input conditioning circuit, a positive direct current (DC) feed-forward path coupled to the positive differential input of the differential input, coupled to the internal common mode voltage sense node, and coupled to the positive differential output of the input conditioning circuit, and a negative DC feed-forward path coupled to the negative differential input of the differential input, coupled to the internal common mode voltage sense node, and coupled to the negative differential output of the input conditioning circuit. The semiconductor die further comprises a signal processing circuit that is coupled to a plurality of the output pins, coupled to the input conditioning circuit, and configured to receive the positive differential output and the negative differential output of the input conditioning circuit, to process the positive and negative differential outputs of the input conditioning circuit, and to output a data communication signal on the plurality of output pins.

BRIEF DESCRIPTION OF THE DRAWINGS

For a detailed description of various examples, reference will now be made to the accompanying drawings in which.

DETAILED DESCRIPTION

When connecting a wireline communication path to a integrated circuit on a printed circuit board (PCB), in the past it has been customary to provide alternating current (AC) coupling on the PCB outside of the integrated circuit. In an example, such AC coupling supports connecting a transmitter and a receiver that have different common mode voltage requirements. For example, the input signal is fed through an AC coupling capacitor located close to the integrated circuit on the PCB. Because of constraints on PCB layout and the increasing density of PCBs, it has become desirable in some integrated circuit (IC) designs to (1) make provisions within the IC to interconnect a transmitter external to the IC and an in-chip receiver with different common mode voltage requirements rather than relying on an AC coupling capacitor located on the PCB external to the IC, and (2) provide a DC signal path with high-speed data throughput. These design objectives, to some extent, constitute antagonistic requirements and thus present a significant design challenge.

The present disclosure provides examples of systems that address the aforementioned design objectives. In accordance with the disclosed examples, a system comprises a semiconductor die, a set of input and output pins connected to the semiconductor die, and a package encapsulating the semiconductor die. The system provides broadband data processing. In an example, the system provides data channel retimers, data transmission buffers, data transmission repeaters, data high-speed interface, or data path interfaces. The system is applicable in long-distance serial wireline communication, where "long-distance" means communication over a distance from 2 centimeters to 200 meters. The system, however, is not limited to long distances, and in examples the system is used over short distances on-package between two dies or for links across a large die. In an example, the system provides data throughput of at least 1 Gigabit per second (Gbps) throughput. In an example, the system provides data throughput of at least 10 Gbps. In an example, the system provides data throughput of at least 25 Gbps. In an example, the system provides data throughput of at least 50 Gbps. In an example, the system provides data throughput of at least 100 Gbps. The teachings of the present disclosure are applicable to systems providing different high-speed data throughput.

Figure 1:
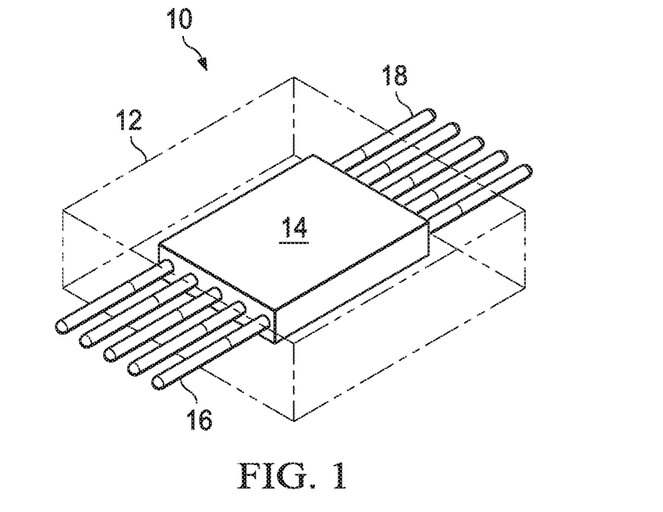
FIG. 1 shows an integrated circuit in accordance with various examples.

FIG. 1 shows an illustration of an integrated circuit (IC) 10 or chip in accordance with various examples. The IC 10 comprises a package 12, a semiconductor die 14 encapsulated within the package 12, a plurality of inputs 16 connected to the die 14, and a plurality of outputs 18 connected to the die 14. In an example, the package 12 comprises plastic or ceramic material. The IC 10 has any number of inputs 16 and any number of outputs 18. The inputs 16 and outputs 18 are connected to the die 14 in any desired pattern and physical layout. While illustrated in FIG. 1 as wires or leads, in an example the inputs 16 and outputs 18 are solder dots or contact points. In examples, the IC 10 is a multi-channel retimer, a multi-channel buffer, a multi-channel repeater, or a multi-channel interface. In examples, the IC 10 is a communication interface integrated circuit. In examples, the IC 10 is a multi-channel communication interface integrated circuit. The die 14 is fabricated with any of a variety of known semiconductor fabrication processes. In some examples, the IC 10 includes at least part of a communication system, examples of which are described below.

Figure 2:
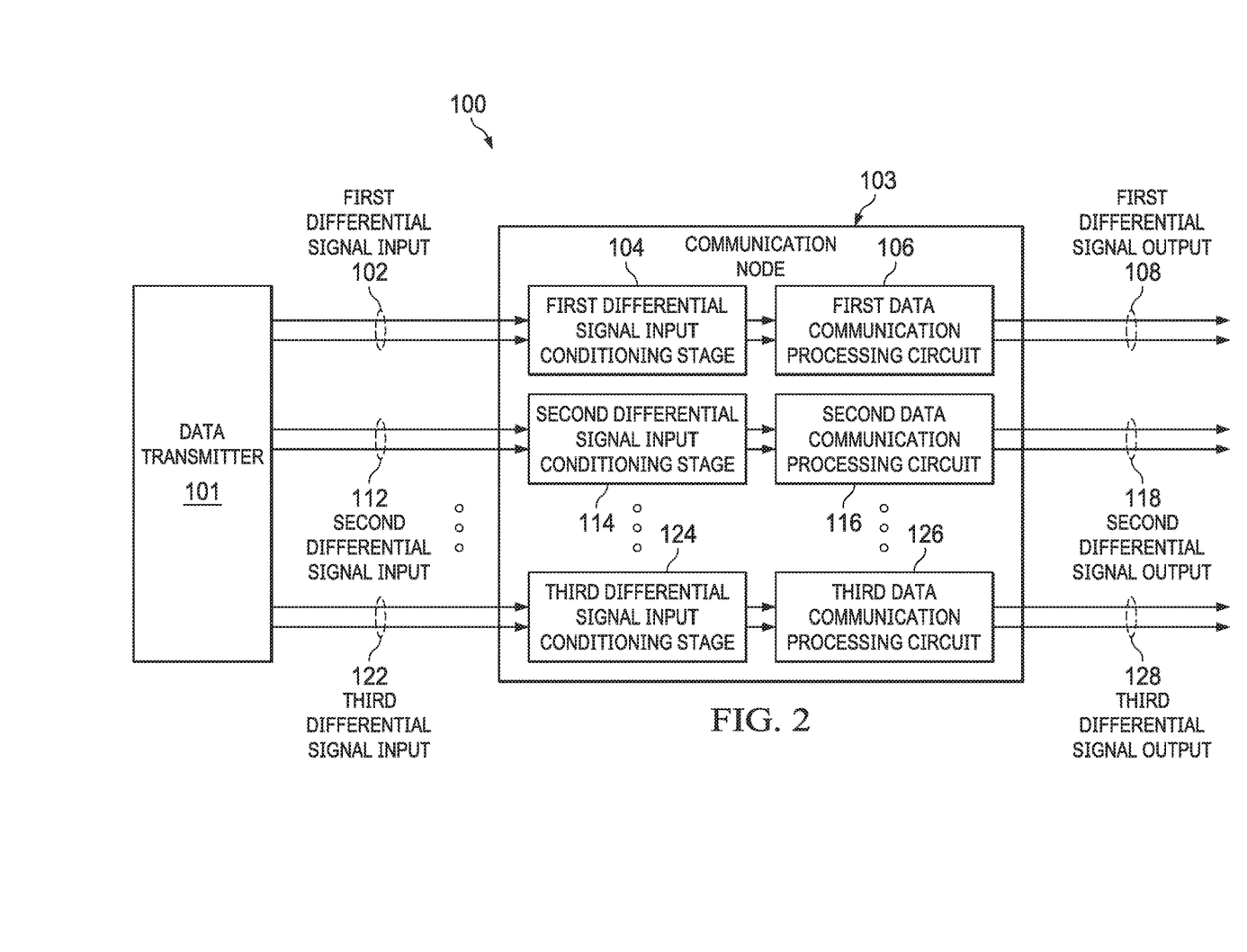
FIG. 2 shows a communication node in accordance with various examples.

FIG. 2 shows a communication system 100. In examples, the system 100 is embodied in a wireline data communication path and can be implemented, in part, with the IC 10 described above. In examples, the system 100 comprises a data transmitter 101 communicatively coupled to a communication node 103. In an example, the communication node 103 comprises the IC 10. The communication node 103 comprises a first differential input 102 coupled to a first differential input conditioning stage 104 that is coupled to a first data communication processing circuit 106 that is coupled to a first signal output 108; a second differential input 112 coupled to a second differential input conditioning stage 114 that is coupled to a second data communication processing circuit 116 that is coupled to a second signal output 118; and a third differential input 122 coupled to a third differential input conditioning stage 124 that is coupled to a third data communication processing circuit 126 that is coupled to a third signal output 128. In use, the signal outputs 108, 118, 128 output a data communication signal. In examples, additional components, such as additional signal inputs, additional differential input conditioning stages, additional data communication processing circuits, and/or additional outputs, are included in the communication node 103.

A differential signal consists of the difference between two separate signals, for example a difference of voltage between two different voltage signals. One component of the differential signal is referred to as the positive component of the differential signal and the other component of the differential signal is referred to as the negative component of the differential signal, albeit both components, at different times, have positive values and negative values. In examples, differential signals are used where noise has a potential to perturb the values of signals, because often the noise perturbs each of the components of the differential signal in the same sense which does not affect the difference between the two components of the differential signal, which is the signal content. Said in another way, in examples a differential signal provides enhanced noise immunity in comparison with a single-ended signal.

The first differential input 102, the components 104 and 106, and the signal output 108 comprise a first channel of the node 103; the second differential input 112, the components 114 and 116, and the signal output 118 comprise a second channel of the node 103; and the differential input 122, the components 124 and 126, and signal output 128 comprise a third channel of the node 103. In examples, the node 103 comprises any desirable number of channels. In an example, the node 103 comprises 16 channels. In an example, the node 103 comprises 24 channels. In an example, the node 103 comprises 32 channels. In examples, the transmitter 101 is communicatively coupled to the node 103 via the differential inputs 102, 112, 122 over a long-distance broadband wireline communication path. For purposes of this disclosure, "long-distance" ranges from 1 centimeter to 200 meters. The node 103, however, is not limited to applications involving long distances, and in examples the node 103 is used over short distances on-package between two dies or for links across a large die. For purposes of this disclosure, "broadband" includes data communication up to 1 Gbps or up to 10 Gbps or up to 25 Gbps or higher data communication rates. It is understood that the data communication industry's trend is to extend the upper boundary of data throughput, thus extending the bounds of the term "broadband."

In examples, the data communication processing circuits 106, 116, 126 are continuous time linear equalizers, decision feedback equalizers, or other differential receivers. The data communication processing circuits 106, 116, 126 are sometimes referred to as signal processing circuits. The data communication processing circuits 106, 116, 126 are sometimes referred to as receivers or alternatively as comprising receivers.

Each of the differential inputs 102, 112, and 122 includes a positive differential input and a negative differential input. The signal content on the differential inputs 102, 112, 122 is contained in the difference between the voltages of the positive differential inputs and the corresponding negative differential inputs. For example, the differential input 102 is the difference between the positive and negative differential inputs corresponding to the differential input 102. The average voltage between a positive differential input and its corresponding negative differential input is referred to as the common mode voltage of that differential input 102, 112, 122. The transmitter 101 provides or outputs the differential inputs 102, 112, 122. The transmitter 101 is configured to output the differential inputs 102, 112, 122 with a predefined common mode voltage. It is desirable that the differential input conditioning stages 104, 114, 124 be configured to interface compatibly with the predefined common mode voltage level that is output by the transmitter 101. Each of the data communication processing circuits 106, 116, 126 has a predefined internal common mode voltage that, in examples, is different from the predefined common mode voltage associated with the transmitter 101.

In examples, each of the differential input conditioning stages 104, 114, 124 provides a desired input impedance to the transmitter 101 (the input impedance seen by the transmitter 101 looking into the differential inputs 102, 112, 124) and provides an input common mode voltage that conforms with a common mode voltage desired by the transmitter 101. In examples, the input impedance provided by each of the differential input conditioning stages 104, 114, 124 is about 50 ohms. As used herein, the statement "about 50 ohms" means between 45 ohms and 55 ohms. In other examples, the differential input conditioning stages 104, 114, 124 provide different predefined input impedances. In examples, the differential input conditioning stages 104, 114, 124 provide internal common mode voltages to the data communication processing circuits 106, 116, 126 that are different from the input common mode voltages. In some contexts, the internal common mode voltages are said to be independent of the input common mode voltages. In examples, the differential input conditioning stages 104, 114, 124 provide a positive and negative differential AC coupled signal path and a positive and negative true DC signal path to feedthrough the differential data received from the transmitter 101 to the data communication processing circuits 106, 116, 126. These combined AC coupled and true DC signal paths implemented by the differential input conditioning stages 104, 114, 124 promote improved bandwidth and greater immunity to baseline wander.

In examples, the signal outputs 108, 118, 128 are differential outputs. In examples, the signal outputs 108, 118, 128 are not differential outputs and are single-ended signal outputs. In examples, the content of the signal outputs 108, 118, 128 is data or data communication content.

Figure 3:
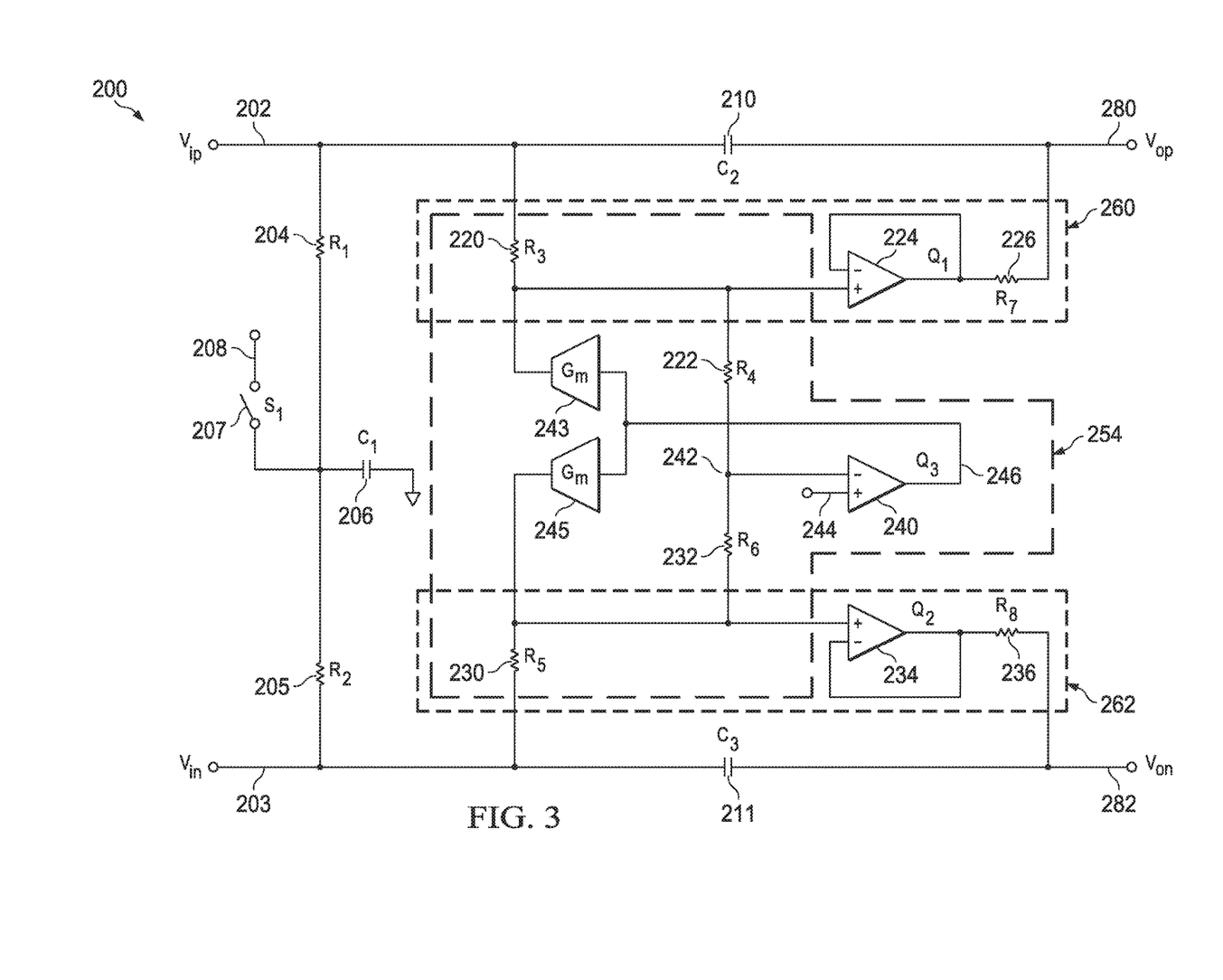
FIG. 3 shows a broadband differential conditioning circuit in accordance with various examples.

FIG. 3 shows a differential input conditioning circuit 200 in accordance with various examples. In examples, each of the differential input conditioning stages 104, 114, 124 described above with reference to FIG. 2 are implemented, at least in part, as the circuit 200 shown in FIG. 3. In some contexts, the differential input conditioning circuit 200 is referred to as a differential conditioning stage. The circuit 200 provides a variety of functions that are subsumed under the rubric of "differential input conditioning." The circuit 200 provides a desired input impedance and input common mode voltage level as seen by a transmitter 101. The circuit 200 provides a desired internal common mode voltage level for internal signal processing circuitry, for example the data communication processing circuits 106, 116, 126, where the internal common mode voltage can be different from the input common mode voltage seen by the transmitter 101. Said in other words, circuit 200 provides an internal common mode voltage that is independent from the input common mode voltage. In operation, the circuit 200 provides an AC coupled differential signal to internal processing circuitry, for example the data communication processing circuits 106, 116, 126. In addition, the circuit 200 provides a true DC signal path to internal processing circuitry, for example the data communication processing circuits 106, 116, 126. The true DC signal path is also a level shifted true DC signal path. While it is understood that all the components of circuit 200 collaboratively provide the totality of functions ascribed to the circuit 200 in the description above, some of the components are more responsible for some of the functions than are other components.

The circuit 200 comprises a positive differential input 202 and a negative differential input 203. In some contexts, the positive differential input 202 and the negative differential input 203 are collectively referred to as a differential input of the circuit 200. This differential input is said to provide a predefined input impedance and to provide a predefined input common mode voltage.

In examples, the circuit 200 comprises a first resistor 204 that is coupled at a first lead to the positive differential input 202 and at a second lead to a first lead of a first capacitor 206. A second lead of the first capacitor 206 is coupled to ground. The circuit 200 further comprises a second resistor 205 coupled at a first lead to the negative differential input 203 and at a second lead to the first lead of the capacitor 206 and to the second lead of the first resistor 204. In examples, the circuit 200 further comprises a switch 207 and an input common mode voltage reference 208. In examples, the input common mode voltage reference 208 is provided as a voltage source derived from a DC voltage supply distributed within the circuit 200, for example derived from tapping into a voltage divider that steps the DC voltage supply down to a desired voltage value. When the switch 207 is controlled closed, the input common mode voltage reference 208 is coupled into the circuit 200 and sets the input common mode voltage of the circuit 200. By adjusting the level or value of the input common mode voltage reference 208, for example by dividing a standard power supply voltage level across a pair of resistors (not shown) or using a potentiometer (not shown) the same design for the circuit 200 is used to accommodate different input common mode voltages desired by different transmitters 101. When the switch 207 is controlled open, as illustrated in FIG. 3, the input common mode voltage of the circuit 200 is floated by the first capacitor 206, and in this example the input common mode voltage is determined by a transmitter coupled to the differential inputs 202, 203, for example the transmitter 101. The values of the first and second resistors 204, 205 establish the input impedance of the circuit 200 seen by the transmitter 101. In examples, the resistance of the first and second resistors 204, 205 is about 50 ohms, but in other examples the resistance of the first and second resistors 204, 205 is different from 50 ohms.

The circuit 200 further comprises a second capacitor 210 and a third capacitor 211. The second capacitor 210 AC couples the positive differential input 202 to a positive differential output 280, and the third capacitor 211 AC couples the negative differential input 203 to a negative differential output 282. A first lead of the second capacitor 210 is coupled to the positive differential input 202, and a second lead of the second capacitor 210 is coupled to the positive differential output 280. A first lead of the third capacitor 211 is coupled to the negative differential input 203, and a second lead of the third capacitor is coupled to the negative differential output 282. In examples, the second and third capacitors 210, 211 establish the interface capacitance seen by the transmitter 101 and establish the maximum data throughput or maximum speed of the circuit 200. In examples, the second and third capacitors 210, 211 have capacitance values of about 1 picofarad (pF). In examples, the second and third capacitors 210, 211 have capacitance values that are less than about 2.5 pF. In other examples, the second and third capacitors 210, 211 have capacitance values different from 1 pF. The second capacitor 210 provides a positive differential AC signal path, and the third capacitor 211 provides a negative differential AC signal path. The positive differential AC signal path is sometimes referred to as a positive AC coupled feed-forward path, and the negative differential AC signal path is sometimes referred to as a negative AC coupled feed-forward path. The second capacitor 210 blocks low-frequency components of the positive differential input 202, and the third capacitor 211 blocks low-frequency components of the negative differential input 203. The second capacitor 210 passes the high-frequency components of the positive differential input 202 to the positive differential output 280, and the third capacitor 211 passes the high-frequency components of the negative differential input 203 to the negative differential output 282.

In examples, the circuit 200 further comprises a third resistor 220, a fourth resistor 222, a fifth resistor 230, and a sixth resistor 232. A first lead of the third resistor 220 is coupled to the positive differential input 202 and a second lead of the third resistor 220 is coupled to a first lead of the fourth resistor 222. A second lead of the fourth resistor 222 is coupled to a first lead of the sixth resistor 232. A second lead of the sixth resistor 232 is coupled to a first lead of the fifth resistor 230, and a second lead of the fifth resistor 230 is coupled to the negative differential input 203. The third resistor 220 and the fourth resistor 222 are coupled in series with each other. The fourth resistor 222 and the sixth resistor 232 are coupled in series with each other. The sixth resistor 232 and the fifth resistor 230 are coupled in series with each other. The third resistor 220, the fourth resistor 222, the sixth resistor 232, and the fifth resistor 230 are coupled in series with one another, in the order given.

The resistors 220, 222, 230, 232 provide an internal common mode voltage at the node 242 where the second lead of the fourth resistor 222 couples to the first lead of the sixth resistor 232. In some contexts, the pin 242 is referred to as an internal common mode voltage sense node. The voltage at node 242 also provides feedback to the circuit 200 for establishing and maintaining a desired internal common mode voltage. The resistors 220, 222 230, 232 also participate in level-shifting the internal common mode voltage of the circuit 200 relative to the input common mode voltage of the circuit 200.

In examples, the circuit 200 further comprises a first operational amplifier (op amp) 224 and a second op amp 234. A positive lead of the first op amp 224 is coupled to the second lead of the third resistor 220 and to the first lead of the fourth resistor 222, a negative lead of the first op amp 224 is coupled to an output of the first op amp 224, and the output of the first op amp 224 is also coupled to a first lead of a seventh resistor 226. A second lead of the seventh resistor 226 is coupled to the positive differential output 280 and to the second lead of the second capacitor 210. The first op amp 224, as connected, acts as a unity gain amplifier or buffer amplifier, feeding a level-shifted internal common mode voltage component and a low-frequency component of the positive differential input 202 into the positive differential output 280 in superposition with the AC coupled high-frequency components of the positive differential input 202 passed by the second capacitor 210 to the positive differential output 280. The signal path from the positive differential input 202 through the third resistor 220, through the first op amp 224, through the seventh resistor 226, and to the positive differential output 280 is referred to as a positive DC feed-forward path 260.

A positive lead of the second op amp 234 is coupled to the second lead of the sixth resistor 232 and to the first lead of the fifth resistor 230, a negative lead of the second op amp 234 is coupled to an output of the second op amp 234, and the output of the second op amp 234 is also coupled to a first lead of an eighth resistor 236. The second lead of the eighth resistor 236 is coupled to the negative differential output 282 and to the second lead of the third capacitor 211. The second op amp 234, as connected, acts as a unity gain amplifier or buffer amplifier, feeding a level-shifted internal common mode voltage component and a low-frequency component of the negative differential input 203 into the negative differential output 282 in superposition with the AC coupled high-frequency components of the negative differential input 203 passed by the third capacitor 211 to the negative differential output 282. The signal path from the negative differential input 203 through the fifth resistor 230, through the second op amp 234, through the eighth resistor 236, and to the negative differential output 282 is referred to as a negative DC feed-forward path 262.

In examples, the circuit 200 further comprises a third op amp 240, a first transconductor 243, and a second transconductor 245. In examples, a transconductor is a voltage controlled current source. A negative input 242 of the third op amp 240 is coupled to the second lead of the fourth resistor 222 and to the first lead of the sixth resistor 232, a positive input of the third op amp 240 is coupled to an internal common mode voltage reference 244, and an output 246 of the third op amp 240 is coupled to an input of the first transconductor 243 and to an input of the second transconductor 245. The internal common mode voltage reference 244 is provided as a voltage source derived from a DC voltage supply distributed within the circuit 200, for example derived from tapping into a voltage divider that steps the DC voltage supply down to the predefined value of the internal common mode voltage. An output of the first transconductor 243 is coupled to the second lead of the third resistor 220. An output of the second transconductor 245 is coupled to the first lead of the fifth resistor 230. The third op amp 240 controls the first transconductor 243 to drive current through the third resistor 220 and controls the second transconductor 245 to drive current through the fifth resistor 230 to drive the internal common mode voltage to agree with the internal common mode voltage reference 244 (e.g., voltage difference between 244 and node 242 is approximately zero). In some contexts, the first transconductor 243 and the second transconductor 245 are referred to as current generators or as voltage controlled current sources. The internal common mode voltage is used by the third op amp 240 as feedback in a control loop.

The resistors 220, 222, 232, and 230; the third op amp 240; and the transconductors 243, 245 establish a level shifter 254. In some contexts, the level shifter 254 is referred to as an internal common mode voltage stage and is coupled to the differential input and configured to generate an internal common mode voltage that is independent of the predefined input common mode voltage. The third op amp 240 and the transconductors 243, 245 maintain the internal common mode voltage of the differential outputs 280, 282 and provide level-shifting relative to the input common mode voltage of the circuit 200. The third op amp 240 senses the actual internal common mode voltage of the circuit 200 on its negative input 242 (the node connecting the second lead of the fourth resistor 222 and the first lead of the sixth resistor 232) and compares this feedback value to the internal common mode voltage reference 244. When the sensed value of internal common mode voltage on negative input 242 differs from the internal common mode voltage reference 244, the output 246 of the third op amp 240 controls the transconductors 243, 245 to flow current through resistors 220, 222, 230, 232 to adapt the actual internal common mode voltage to equal the internal common mode voltage reference 244. The sensed value of the actual internal common mode voltage is present at the node formed by the second lead of the fourth resistor 222, the first lead of the sixth resistor 232.

In examples, most of the components of the circuit 200 manifest symmetry in topology and component values between a positive differential portion of the circuit 200 and a negative differential portion of the circuit 200. The resistance value of the first resistor 204 is about equal to the resistance value of the second resistor 205. The capacitance of the second capacitor 210 is about equal to the capacitance of the third capacitor 211. The resistance value of the third resistor 220 is about equal to the resistance value of the fifth resistor 230. The resistance value of the fourth resistor 222 is about equal to the resistance value of the sixth resistor 232. The resistance value of the seventh resistor 226 is about equal to the resistance value of the eighth resistor 236.

In examples, the first resistor 204 is about 50 ohms, the second resistor 205 is about 50 ohms, the third resistor 220 is about 10 k ohms, the fifth resistor 230 is about 10 k ohms, the fourth resistor 222 is about 200 k ohms, the sixth resistor 232 is about 200 k ohms, the seventh resistor 226 is about 20 k ohms, and the eighth resistor 236 is about 20 k ohms. In other examples, the resistance values of resistors 204, 205, 220, 222, 230, 232, 226, 236 are different from those listed above. In examples, the resistance of the sum of the resistance of the third resistor 220 and the resistance of the fourth resistor 222 is much greater than the resistance of the first resistor 204; the resistance of the fourth resistor 222 is much greater than the resistance of the third resistor 220; the resistance of the sum of the resistance of the fifth resistor 230 and the sixth resistor 232 is much greater than the resistance of the second resistor 205; the resistance of the sixth resistor 232 is much greater than the resistance of the fifth resistor 230. As used herein, "much greater" in the context of "the resistance of resistor X is much greater than the resistance of resistor Y" means at least 10 times greater. In examples, the first capacitor 206 is about 50 pF, the second capacitor 210 is about 1 pF, and the third capacitor 211 is about 1 pF. In other examples, the capacitance values of capacitors 206, 210, 211 are different from those listed above.

Figure 4:
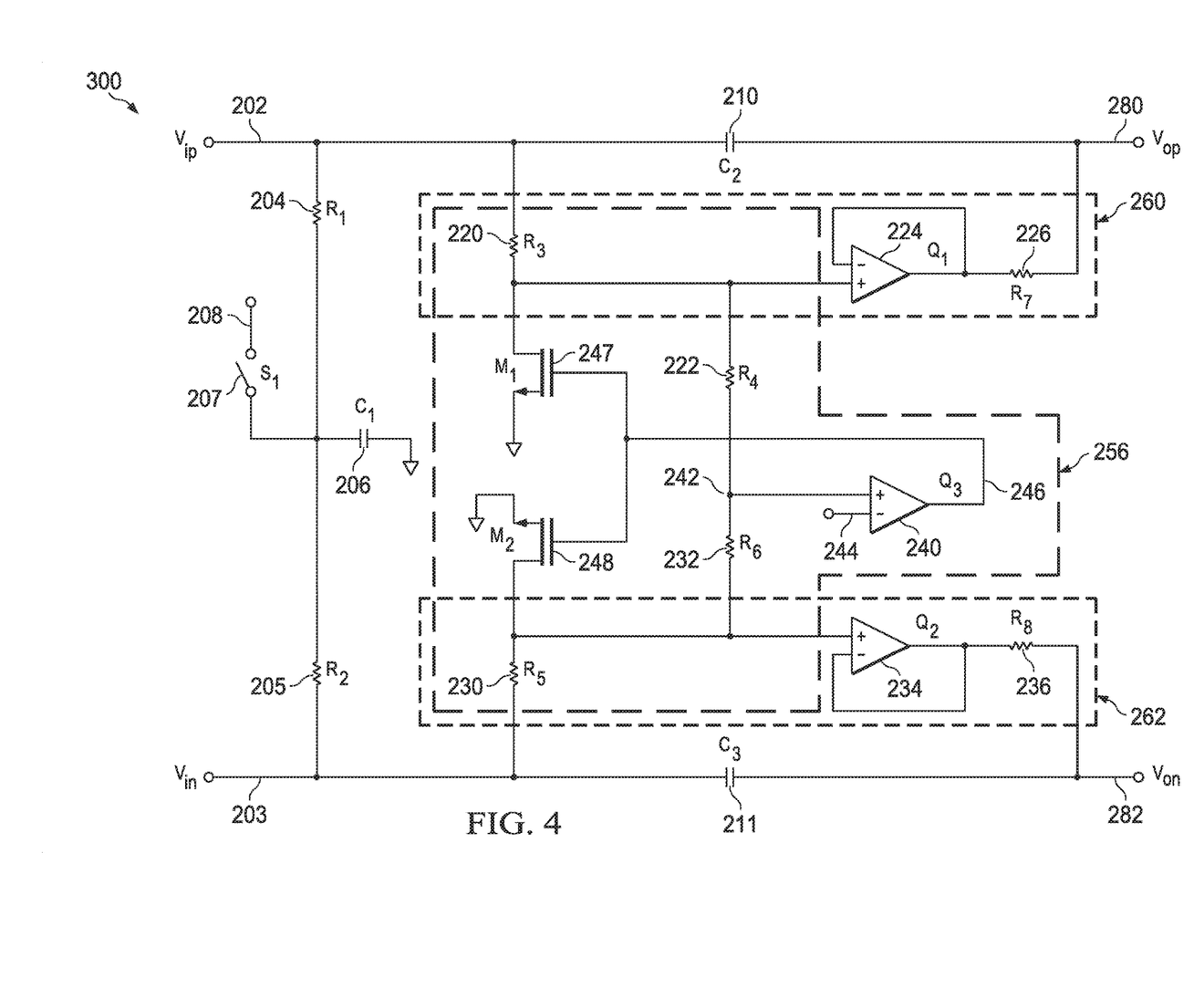
FIG. 4 shows another broadband differential conditioning circuit in accordance with various examples.

FIG. 4 shows a differential input conditioning circuit 300 in accordance with various examples. The circuit 300 is substantially similar to the circuit 200 described above, with the first transconductor 243 of circuit 200 replaced by a first NMOSFET 247, the second transconductor 245 of circuit 200 replaced by a second NMOSFET 248, and the polarity of the inputs of the operational amplifier 240 as illustrated in FIG. 4. MOSFETs are metal oxide semiconductor (MOS) field effect transistors (FETs). A source lead of the first NMOSFET 247 and a source lead of the second NMOSFET 248 are coupled to ground. In examples, the transconductors 243, 245 are replaced by a first bipolar junction transistor (BJT) and a second BJT. The resistors 220, 222, 232, and 230; the third op amp 240; and the NMOSFETS 247, 248 establish a negative level shifter 256 (e.g., the internal common mode voltage level is less than the input common mode voltage level).

Figure 5:
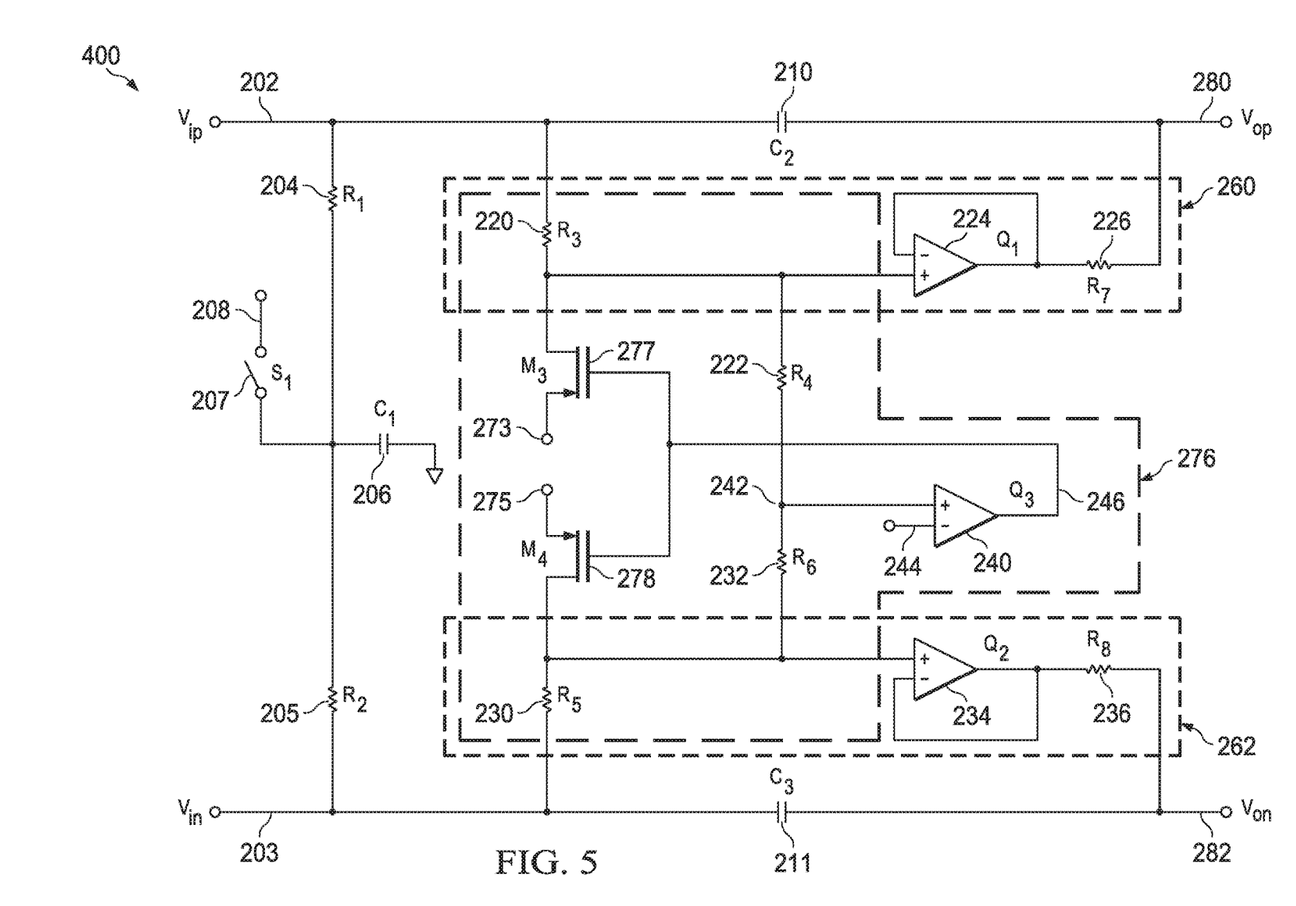
FIG. 5 shows yet another broadband differential conditioning circuit in accordance with various examples.

FIG. 5 shows a differential input conditioning circuit 400 in accordance with various examples. The circuit 400 is substantially similar to the circuit 200 described above, with the first transconductor 243 of circuit 200 replaced by a first PMOSFET 277, the second transconductor 245 of circuit 200 replaced by a second PMOSFET 278, and the polarity of the inputs of the operational amplifier 240 as illustrated in FIG. 5. A source lead of the first PMOSFET 277 is coupled to a voltage source 273, and a source lead of the second PMOSFET 278 is coupled to a voltage source 275. In examples, the voltage sources 273, 275 are supplied from the same voltage source. The resistors 220, 222, 232, and 230; the third op amp 240; and the PMOSFETS 277, 278 establish a positive level shifter 276 (e.g., the internal common mode voltage level is greater than the input common mode voltage level).

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

The above discussion is meant to be illustrative of the principles and various examples of the present disclosure. Numerous variations and modifications will become apparent to those skilled in the art once the above disclosure is fully appreciated. It is intended that the following claims be interpreted to embrace all such variations and modifications.

What is claimed is:

1. A semiconductor die, comprising:
a level shifter coupled to a positive differential input and coupled to a negative differential input, comprising a first operational amplifier, wherein the first operational amplifier is configured to generate an internal common mode voltage at an internal common mode voltage sense node independent of an input common mode voltage of the positive differential input and the negative differential input and where the internal common mode voltage sense node is coupled to a positive differential output and is coupled to a negative differential output;
a positive alternating current (AC) coupled feed-forward path comprising a first capacitor coupled to the positive differential input and coupled to the positive differential output;
a negative AC coupled feed-forward path comprising a second capacitor coupled to the negative differential input and coupled to the negative differential output;
a positive direct current (DC) feed-forward path coupled to the differential input, coupled to the internal common mode voltage sense node, and coupled to the positive differential output; and
a negative DC feed-forward path coupled to the differential input, coupled to the internal common mode voltage sense node, and coupled to the negative differential output;
a third resistor, a fourth resistor, a fifth resistor, and a sixth resistor coupled in series between a first node coupled to receive the positive differential input and a second node coupled to receive the negative differential input;
wherein the positive DC feed-forward path comprises the third resistor, a seventh resistor, and a second operational amplifier, the second operational amplifier configured as a buffer amplifier having an output coupled to a first lead of the seventh resistor and having a positive input coupled to the third node, the seventh resistor having a second lead coupled to the positive differential output, and the negative DC feed-forward path comprises the sixth resistor, an eighth resistor, and a third operational amplifier, the third operational amplifier configured as a buffer amplifier having an output coupled to a first lead of the eighth resistor and having a positive input coupled to the fourth node, the eighth resistor having a second lead coupled to the negative differential output.

2. The semiconductor die of claim 1, wherein the level shifter comprises:
a first transconductor coupled to a third node connecting the third and fourth resistors and controlled by an output of the operational amplifier; and
a second transconductor coupled to a fourth node connecting the fifth and sixth resistors and controlled by the output of the first operational amplifier.

3. The semiconductor die of claim 2, wherein the internal common mode voltage sense node is a fifth node connecting the fourth resistor to the fifth resistor.

4. The semiconductor die of claim 2, wherein the first transconductor and the second transconductor are metal oxide semiconductor (MOS) field effect transistors (FETs).

5. The semiconductor die of claim 1, wherein semiconductor die is configured to present an input impedance of about 50 ohms to the positive differential input and an input impedance of about 50 ohms to the negative differential input.

6. The semiconductor die of claim 1, further comprising an input common mode voltage reference that is configured to establish an input common mode voltage of the semiconductor die.

7. A semiconductor die, comprising:
a differential input conditioning stage comprising:
a differential input configured to provide a predefined input impedance and to provide a predefined input common mode voltage,
a level shifter coupled to the differential input and configured to generate an internal common mode voltage at an internal common voltage sense node independent of the predefined input common mode voltage,
a positive alternating current (AC) coupled feed-forward path having a first capacitor coupled to the differential input and coupled to a positive differential output of the differential input conditioning stage,
a negative AC coupled feed-forward path having a second capacitor coupled to the differential input and coupled to a negative differential output of the differential input conditioning stage, a positive direct current (DC) feed-forward path coupled to the differential input, coupled to the internal common mode voltage sense node, and coupled to the positive differential output of the differential input conditioning stage, and
a negative DC feed-forward path coupled to the differential input, coupled to the internal common mode voltage sense node, and coupled to the negative differential output of the differential input conditioning stage,
and
a data communication processing circuit that is coupled to the positive differential output, coupled to the negative differential output of the differential input conditioning stage, is configured to output a data communication signal;
a third resistor, a fourth resistor, a fifth resistor, and a sixth resistor coupled in series between a first node coupled to receive the positive differential input and a second node coupled to receive the negative differential input;
wherein the positive DC feed-forward path comprises the third resistor, a seventh resistor, and a second operational amplifier, the second operational amplifier configured as a buffer amplifier having an output coupled to a first lead of the seventh resistor and having a positive input coupled to the third node, the seventh resistor having a second lead coupled to the positive differential output, and
the negative DC feed-forward path comprises the sixth resistor, an eighth resistor, and a third operational amplifier, the third operational amplifier configured as a buffer amplifier having an output coupled to a first lead of the eighth resistor and having a positive input coupled to the fourth node, the eighth resistor having a second lead coupled to the negative differential output.

8. The semiconductor die of claim 7, wherein the data communication processing circuit is configured to receive a signal from the positive differential output and the negative differential output of the differential input conditioning stage with a common mode voltage level associated with the internal common mode voltage reference.

9. The semiconductor die of claim 7, wherein the data communication processing circuit is a continuous time linear equalizer.

10. The semiconductor die of claim 7, wherein the data communication processing circuit is a decision feedback equalizer.

11. The semiconductor die of claim 7, wherein the die comprises 16 interface channels.

12. The semiconductor die of claim 7, wherein the die comprises 32 interface channels.

* * * * *